United States Patent
Funabashi et al.

(10) Patent No.: US 6,661,828 B2
(45) Date of Patent: Dec. 9, 2003

(54) SEMICONDUCTOR LASER DEVICE

(75) Inventors: Masaki Funabashi, Tokyo (JP); Ryosuke Yatsu, Tokyo (JP); Akihiko Kasukawa, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 111 days.

(21) Appl. No.: 09/793,881

(22) Filed: Feb. 28, 2001

(65) Prior Publication Data

US 2002/0031152 A1 Mar. 14, 2002

(30) Foreign Application Priority Data

Feb. 29, 2000 (JP) ......................................... 2000-052997
Feb. 20, 2001 (JP) ......................................... 2001-043208

(51) Int. Cl.⁷ .............................. H01S 3/08; H01S 5/00
(52) U.S. Cl. ............................ 372/96; 372/45; 372/46
(58) Field of Search ............................... 372/96, 43–50, 372/102

(56) References Cited

U.S. PATENT DOCUMENTS

| | | | | |
|---|---|---|---|---|
| 5,459,747 A | * | 10/1995 | Takiguchi et al. | ............ 372/50 |
| 6,224,667 B1 | * | 5/2001 | Kato | ............ 117/84 |
| 6,330,265 B1 | * | 12/2001 | Kinoshita | ............ 372/50 |
| 6,373,874 B1 | * | 4/2002 | Kidoguchi et al. | ............ 372/45 |

OTHER PUBLICATIONS

Luo et al."Gain Coupled Distributed Feedback Semiconductor Lasers with an Absorptive Conduction–Type Inverted Grating." IEEE Photonics Technology Letters, vol. 4, No. 7, Jul. 1992, pp. 692–695.*

* cited by examiner

Primary Examiner—Paul Ip
Assistant Examiner—James Menefee
(74) Attorney, Agent, or Firm—Oblon, Spivak, McClelland, Maier & Neustadt, P.C.

(57) ABSTRACT

A DFB Laser of buried hetero type with a lasing wavelength of 1550 nm, having on an InP substrate a laminated structure of an InP buffer layer, an active layer, a 200-nm-thickness InP spacer layer, a 240-nm-period diffraction grating made of a 20-nm-thickness GaInAsP layer, and an InP first cladding layer in which diffraction grating is buried. The peak wavelength $\lambda$max of the optical gain distribution of the active layer is approximately 1530 nm. The bandgap wavelength of the diffraction grating is approximately 1510 nm. The laminated structure is etched into mesa stripes, on both sides of which are formed p/n-separated current blocking regions. Since the diffraction grating is formed of GaInAsP having $\lambda$g of approximately 1510 nm, little absorption occurs at wavelengths around the lasing wavelength 1550 nm. The absorption is coefficient with respect to the peak wavelength of the optical gain distribution of the active layer is greater than the absorption coefficient with respect to the lasing wavelength.

11 Claims, 10 Drawing Sheets

SEMICONDUCTOR LASER DEVICE

BACKGROUND OF THE INVENTION

1. Field of the Invention

The present invention relates to a semiconductor laser device which includes a wavelength selecting structure formed in the vicinity of an active layer in a resonator structure, the wavelength selecting structure being capable of selecting a lasing wavelength $\lambda_e$ independent of the optical gain distribution of the active layer, for emitting laser light of the selected lasing wavelength $\lambda_e$. In particular, the present invention relates to a semiconductor laser device which is capable of a stable single-mode lasing in a wide temperature range, has a high mode-to-side-mode suppression ratio (SMSR) at the lasing wavelength, and is best suited especially to a light source for optical communication.

2. Description of the Related Art

A distributed feedback semiconductor laser (hereinafter, referred to as a DFB laser) has in its resonator a diffraction grating for changing the real part and/or the imaginary part of the refractive index (complex refractive index) periodically, so that only the light having a specific wavelength is fed-back for wavelength selectivity.

In a DFB laser having in the vicinity of its active layer a diffraction grating including a compound semiconductor layer that periodically differs in refractive index from the surroundings, the lasing wavelength $\lambda_{DFB}$ of the DFB laser is determined by the relation $\lambda_{DFB}=2n_{\textit{eff}}\Lambda$, where $\Lambda$ is the period of the diffraction grating and $n_{\textit{eff}}$ is the effective refractive index of the waveguide. Thus, the period $\Lambda$ of the diffraction grating and the effective refractive index $n_{\textit{eff}}$ of the waveguide can be adjusted to set the lasing wavelength $\lambda_{DFB}$ independent of the peak wavelength of the optical gain of the active layer.

For example, when the lasing wavelength of the DFB laser is set at wavelengths shorter than the peak wavelength of the optical gain distribution of the active layer, the differential gain increases to improve the DFB laser in high-speed modulation characteristic and the like, Setting the lasing wavelength of the DFB laser at around the peak wavelength of the optical gain distribution of the active layer decreases the threshold current at room temperature.

Setting the lasing wavelength of the DFB laser at wavelengths longer than the peak wavelength of the optical gain distribution of the active layer makes the temperature characteristic suitable, which improves the operational characteristics at higher temperatures as well as the high intensity output characteristics at higher temperatures or under higher current injection.

By the way, in the conventional DFB laser, the lasing wavelength, whether falling at wavelengths shorter or longer than the peak wavelength of the optical gain distribution, is set within a close wavelength range of several tens of nanometers from the peak wavelength of the optical gain distribution of the active layer. The reasons for this are that (1) the threshold current can be held down, and (2) the single-mode operation is maintained.

Moreover, in the conventional DFB laser, the compound semiconductor layer constituting the diffraction grating has a bandgap energy considerably higher than the bandgap energy of the active layer and the energy of the lasing wavelength. More specifically, the bandgap wavelength of the compound semiconductor layer constituting the diffraction grating typically resides in wavelengths 100 nm or more shorter than the lasing wavelength, and accordingly the compound semiconductor layer is transparent to the lasing wavelength, with little light absorption or loss. The diffraction grating which shows periodical, spatial changes in refractive index is fabricated by laminating the compound semiconductor layers, followed by etching to form rows of layers which extend in parallel and periodically.

Here, the conventional DFB laser will be further described in the concrete. The conventional DFB laser can be broadly divided into a first conventional example in which $\lambda e$ is 1550 nm, $\lambda g$ falls within the range of 1200 and 1300 nm, and $\lambda g<\lambda max<\lambda e$ holds as shown in FIG. 8($a$), and a second conventional example in which $\lambda e$ is 1550 nm, $\lambda g$ is 1650 nm, and $\lambda max<\lambda e<\lambda g$ holds as shown in FIG. 8($b$).

In the first conventional example, $\lambda e-\lambda g$ 300 nm. Meanwhile, $\lambda e-\lambda g=-100$ nm in the second conventional example, Here, the full-lined curve in FIG. 8($b$) shows the optical gain distribution of the active layer with respect to the wavelength on the abscissa. The broken-lined curve is a curve showing the amount of absorption (loss) in the diffraction grating layer with respect to the wavelength on the abscissa.

In this connection, $\lambda e$ is the lasing wavelength of the DFB laser determined by the period of the diffraction grating and the effective refractive index of the waveguide, $\lambda g$ is the bandgap wavelength of the diffraction grating layer, and $\lambda max$ is the peak wavelength of the optical gain distribution of the active layer. The bandgap wavelength of the buried layer, or typically an InP layer, in the diffracting grating layer is $\lambda InP$ (=920 nm).

Nevertheless, in the conventional DFB laser, when the space period of the diffraction grating was adjusted to set the lasing wavelength of the DFB laser at wavelengths longer than the peak wavelength of the optical gain distribution of the active layer, Fabry-Perot lasing sometimes occurred not at the set lasing wavelength of the DFB laser but at the peak wavelength of the optical gain distribution of the active layer.

Moreover, even if the DFB laser lases at the designed lasing wavelength, there is a problem that a side mode suppression ratio (SMSR) of adequate magnitude cannot be secured between the lasing mode at the designed lasing wavelength of the DFB laser and the mode around the peak wavelength of the optical gain distribution of the active layer. For example, in the conventional DFB laser, the side mode suppression ratio (SMSR), though depending on the amount of detuning to the lasing wavelength of the DFB laser, falls within a comparatively small range of 35 and 40 dB. As a result, the conventional DFB laser has a problem in that it was impossible for the lasing wavelength of the DFB laser to be enlarged in the amount of detuning with respect to the peak wavelength of the optical gain distribution of the active layer.

To be more specific, the first conventional example with the lasing wavelength $\lambda e$ of the DFB laser greater than the bandgap wavelength $\lambda g$ of the diffraction grating layer has the advantages that the absorption loss at the lasing wavelength $\lambda e$ is small, the threshold current is accordingly low, and the optical output-injection current characteristics are favorable. However, the smaller difference in refractive index between the diffraction grating layer and the InP buried layer requires a reduction of the distance between the diffraction grating and the active layer. As a result, the coupling coefficient varies greatly depending on the thickness of the diffraction grating layer and the duty ratio, which makes it difficult to fabricate same-characteristic DFB lasers with stability.

Moreover, assuming that the absorption coefficient with respect to the lasing wavelength $\lambda e$ of the DFB laser is $\alpha e$ and the absorption coefficient with respect to the bandgap wavelength of the active layer, or the peak wavelength $\lambda \max$ of the optical gain distribution of the active layer, is $\alpha \max$, then $\alpha e \approx \alpha \max \approx 0$. This means a smaller suppression effect both in the Fabry-Perot lasing mode in the vicinity of the peak wavelength of the optical gain distribution of the active layer and in the lasing mode of the DFB laser. Accordingly, there was a problem is that the absolute value of the detuning amount $|\lambda e - \lambda \max|$ cannot be made greater since an increase in the absolute value of the detuning amount $|\lambda e - \lambda \max|$ lowers the single-mode properties of the longitudinal mode.

In the second conventional example in which the bandgap wavelength $\lambda g$ of the diffracting grating layer exceeds the lasing wavelength $\lambda e$ of the DFB laser, the greater difference in refractive index between the diffraction grating layer and the InP buried layer makes it possible to increase the distance between the diffraction grating and the active layer. As a result, the coupling coefficient is prevented from varying with the thickness of the diffraction grating layer and the duty ratio. Thus, same-characteristic DFB lasers can be fabricated with stability, to provide an advantage of high product yields.

On the other hand, the higher absorption loss with respect to the lasing wavelength $\lambda e$ results in a diffraction grating of absorption type, producing problems of higher threshold current and unfavorable optical output-injection current characteristics. Moreover, despite of $\alpha e \approx \alpha \max > 0$ which provides suppression effects both in the Fabry-Perot lasing mode and in the lasing mode of the DFB laser, there was a problem that the absolute value of the detuning amount $|\lambda e - \lambda \max|$ cannot be made greater since an increase in the absolute value of the detuning amount $|\lambda e - \lambda \max|$ lowers the single-mode properties of the longitudinal mode. In the above description, the problem in the peak wavelength of the optical gain distribution of the active layer and the lasing wavelength is explained by exemplifying the DFB laser. However, this problem is not limited to the DFB laser, and is commonly associated with semiconductor laser devices each including a wavelength selecting structure in the vicinity of the active layer within the resonator structure to emit laser light having a selected wavelength $\lambda e$, the wavelength selecting structure being such that the lasing wavelength $\lambda e$ can be selected independently of the optical gain of the active layer.

SUMMARY OF THE INVENTION

In view of the foregoing and in order to solve the foregoing problems, it is a first object of the present invention to provide a semiconductor laser device which is low in the absorption loss at the lasing wavelength of the DFB laser and high in the absorption loss at the peak wavelength of the optical gain distribution of the active layer, is accordingly low in threshold current, is favorable in optical output-injection current characteristics, and can maintain favorable single-mode properties of the longitudinal mode even if the absolute value of the detuning amount $|\lambda e - \lambda \max|$ is increased. A second object of the present invention is to provide a semiconductor laser device which varies little in the coupling coefficient with the thickness of the diffraction grating layer and the duty ratio of the DFB laser, and thus is high in product yield.

A semiconductor laser device according to the present invention (hereinafter, referred to as a first invention) is a semiconductor laser device including a wavelength selecting structure formed in a vicinity of an active layer in a resonator structure, the wavelength selecting structure being capable of selecting a lasing wavelength $\lambda e$ independent of the optical gain distribution of the active layer, for emitting laser light of the selected lasing wavelength $\lambda e$, wherein
    an absorption region made of a compound semiconductor layer having an absorption coefficient $\alpha \max$ with respect to a peak wavelength $\lambda \max$ of the optical gain distribution of the active layer which exceeds an absorption coefficient $\alpha te$ of the absorption region with respect to the lasing wavelength $\lambda e$, is formed in the vicinity of the active layer.

As employed in the first invention as well as the second and third inventions to be described later, a semiconductor laser device including a wavelength selecting structure formed in a vicinity of an active layer in a resonator structure, the wavelength selecting structure being capable of selecting a lasing wavelength $\lambda e$ independent of the optical gain distribution of the active layer, for emitting laser light of the selected lasing wavelength $\lambda e$ refers to, for example, a distributed feedback (DFB) semiconductor laser device, a distributed Bragg reflector (DBR) semiconductor laser device, a fiber Bragg grating (FBG) semiconductor laser module, or the like.

Moreover, the term "vicinity of the active layer" means existing within the range capable of detecting the light produced in the active layer.

The absorption region wherein the absorption coefficient with respect to the peak wavelength of the optical gain distribution of the active layer exceeds the absorption coefficient with respect to the lasing wavelength of the semiconductor laser device is provided so that only the mode in the vicinity of the peak wavelength of the optical gain distribution of the active layer is selectively absorbed to suppress Fabry-Perot lasing in the vicinity of the peak wavelength of the optical gain distribution of the active layer. This can improve the wavelength selectivity for the lasing wavelength and enlarge the side mode suppression ratio (SMSR) as well, thereby enhancing the single-mode properties. Thus, the product yield improves.

In other words, since the Fabry-Perot lasing in the vicinity of the peak wavelength of the optical gain distribution of the active layer is suppressed selectively, favorable single-mode properties of the longitudinal mode can be maintained even if the amount of detuning ($\lambda e - \lambda \max$) is increased. Moreover, since the single mode can be maintained over high operating temperatures, the high-power characteristics at high in temperature is favorable.

Another semiconductor laser device according to the present invention (hereinafter, referred to as a second invention) is a semiconductor laser device including a wavelength selecting structure formed in a vicinity of an active layer in a resonator structure, the wavelength selecting structure being capable of selecting a lasing wavelength $\lambda e$ independent of the optical gain distribution of the active layer, wherein:
    an absorption region made of a compound semiconductor layer is arranged in the resonator structure; and
    a bandgap wavelength $\lambda g$ of the absorption region and the lasing wavelength $\lambda e$ satisfy $0 < \lambda e - \lambda g \leq 100$ nm.

The absorption region employed in the second and third inventions refers to a region made of a compound semiconductor layer, of which a bandgap wavelength $\lambda g$ and the lasing wavelength $\lambda e$ satisfy $0 < \lambda e - \lambda g \leq 100$ nm. It is a broad concept including not only diffraction grating layers but also compound semiconductor layers other than the diffraction grating layers. In the description of the prior art, as described above, the bandgap wavelength of the diffraction grating layer is defined as $\lambda g$. In the second and third inventions, however, the definition of $\lambda g$ in the prior art is extended so that $\lambda g$ is defined to cover the bandgap wavelength of the absorption region.

In the second invention, given that the semiconductor laser device is a DFB laser, the bandgap wavelength $\lambda g$ of the absorption region, or the bandgap wavelength $\lambda g$ of the diffraction grating layer, and the lasing wavelength $\lambda e$ of the DFB laser satisfy $0<\lambda e-\lambda g \leq 100$ nm. Since the lasing wavelength $\lambda e$ of the DFB laser is greater than the bandgap wavelength $\lambda g$ of the diffraction grating layer, there are advantages that the absorption loss at the lasing wavelength $\lambda e$ is small, the threshold current is accordingly low, and the optical output-injection current characteristics are favorable.

Furthermore, given that the buried layer is an InP layer, the diffraction grating layer and the InP buried layer have a greater difference in refractive index as in the second conventional example, which makes it possible to increase the distance between the diffraction grating and the active layer. As a result, the coupling coefficient is prevented from varying with the thickness of the diffraction grating layer and the duty ratio. Thus, same-characteristic DFB lasers can be fabricated with stability, to provide an advantage of high product yields.

That is, the second invention has the advantages of both the first and second conventional examples.

Another semiconductor laser device according to the present invention (hereinafter, referred to as a third invention) is a semiconductor laser device including a wavelength selecting structure formed in a vicinity of an active layer in a resonator structure, the wavelength selecting structure being capable of selecting a lasing wavelength $\lambda e$ independent of the optical gain distribution of the active layer, wherein:

an absorption region is provided in the resonator structure, the absorption region being made of a compound semiconductor layer having an absorption coefficient $\alpha max$ with respect to a peak wavelength $\lambda max$ of the optical gain distribution of the active layer which exceeds an absorption coefficient $\alpha e$ of the absorption region with respect to the lasing wavelength $\lambda e$; and a bandgap wavelength $\lambda g$ of the absorption region and the lasing wavelength $\lambda e$ satisfy $0<\lambda e-\lambda g \leq 100$ nm.

Note that the third invention has the effects of both the first and second inventions.

In the second and third inventions, the value of $\lambda-\lambda g$ is greater than zero and equal to or less than 100 nm, more preferably, greater than zero and equal to or less than 70 nm.

Moreover, in the second and third inventions, the peak wavelength $\lambda max$ of the optical gain distribution of the active layer satisfies either $\lambda g<\lambda max<\lambda e$ or $\lambda max<\lambda g<\lambda e$ as shown in FIGS. 9(a) and (b).

Satisfying $\lambda g<\lambda max<\lambda e$ makes temperature characteristics favorable, improving the operating characteristics at high temperature as well as the high-power characteristics at high temperature or under large current injection. For example, settings are made so that $\lambda e-\lambda max=20$ nm and $\lambda e-\lambda g=50$ nm. Now, satisfying $\lambda max<\lambda g<\lambda e$ allows greater $\alpha max$, which is effective at suppressing the Fabry-Perot mode sufficiently. For example, $\lambda e-\lambda max=20$ nm, and $\lambda g-\lambda max$ ranges from 10 nm to 20 nm.

In the first and third inventions, the difference between the absorption coefficient $\alpha max$ with respect to the peak wavelength $\lambda max$ of the optical gain distribution of the active layer and the absorption coefficient $\alpha e$ with respect to the lasing wavelength $\lambda e$, or $\alpha max-\alpha e$, is preferably greater for the sake of exercising the effects of the present invention. In practice, however, the effects of the present invention can be obtained from $\alpha max-\alpha e \geq 1$ cm$^{-1}$ in terms of waveguide loss. More significant effects can be obtained from $\alpha max-\alpha e \geq 5$ cm$^{-1}$.

It is also preferable that $\alpha e$ is substantially zero in the absorption region, or that the absorption region is transparent to the lasing wavelength $\lambda e$. It follows that the provision of the absorption region does not increase the waveguide loss at the lasing wavelength, nor reduce the threshold current and luminous efficiency.

Furthermore, in the first and third invention, the provision of an absorption region having a steep absorption edge owing to quantum effects, e.g. the provision of a quantum well layer, quantum fine line or a quantum dot layer having a steep absorption edge as a selective absorption region, can realize a great difference between the absorption coefficient $\alpha max$ with respect to the gain peak wavelength of the active layer and the absorption coefficient $\alpha e$ with respect to the lasing wavelength. Incidentally, the term "quantized" as employed herein means that the compound semiconductor layer constituting the absorption region is reduced in size to a thickness on the order of quantum mechanical wavelengths of electrons so that it can exert quantum effects.

Moreover, in the first and third inventions, the wavelength selecting structure may be constituted as a diffraction grating. A selective absorption layer which functions as the absorption region may be formed in the vicinity of the active layer separately from the diffraction grating.

Incidentally, it does not matter whether the selective absorption layer is opposed to the diffraction grating across the active layer, or arranged on the same side as the diffraction grating. However, the opposite-side arrangement has a higher degree of flexibility in design since it allows arbitrary selection of the distance from the active layer.

In the first through third inventions, it is possible to increase the differential gain at high frequencies and provide favorable high-speed modulation characteristics by making the absorption region of a quantized compound semiconductor layer and setting the peak wavelength $\lambda max$ of the optical gain distribution of the active layer to satisfy $\lambda e<\lambda max$ with respect to the lasing wavelength $\lambda e$ as shown in FIG. 10.

According to the first invention, the absorption region made of a compound semiconductor layer having the absorption coefficient $\alpha max$ with respect to the peak wavelength $\lambda max$ of the optical gain distribution of the active layer which exceeds an absorption coefficient $\alpha e$ of the absorption region with respect to the lasing wavelength $\lambda e$ is formed in the vicinity of the active layer. Thus, a DFB laser device, for example, can suppress the lasing in the Fabry-Perot mode near the peak wavelength $\lambda max$ of the optical gain distribution of its active layer, thereby allowing a higher mode-to-side-mode suppression ratio (SMSR) at the set lasing wavelength.

Moreover, since the amount of detuning can be made greater, it is possible to maintain a stable single-mode lasing in a wide temperature range.

According to the second invention, the bandgap wavelength $\lambda g$ of the absorption region and the lasing wavelength $\lambda e$ of the DFB laser satisfy $0<\lambda e-\lambda g \leq -100$ nm. Since the lasing wavelength $\lambda e$ of the DFB laser is greater than the bandgap wavelength $\lambda g$ of the diffraction grating layer, there are advantages that the absorption loss at the lasing wavelength λe is small, the threshold current is accordingly low, and the optical output-injection current characteristics are favorable.

Furthermore, given that the buried layer is an InP layer, the diffraction grating layer and the InP buried layer have a greater difference in refractive index, which makes it possible to increase the distance between the diffraction grating and the active layer As a result, the coupling coefficient is prevented from varying with the thickness of the diffraction grating layer and the duty ratio. Thus, same-characteristic DFB laser can be fabricated with stability, to provide an advantage of high product yields.

The third invention offers the effects of both the first and third inventions.

PREFERRED EMBODIMENTS OF THE INVENTION

Hereinafter, the embodiment of the present invention will be described in the concrete and in detail with reference to preferred embodiments and the accompanying drawings.
Embodiment 1

Figure 1:
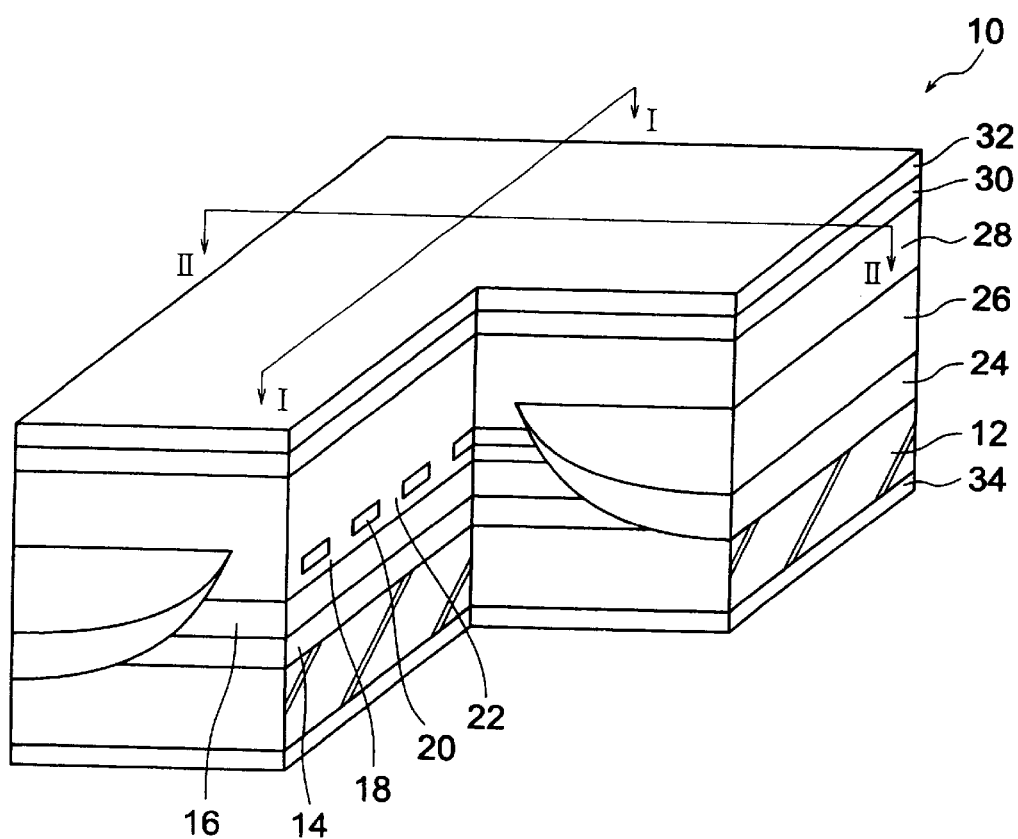
FIG. 1 is a partially sectional perspective view showing the structure of a semiconductor layer device according to a first embodiment.
Figure 2:
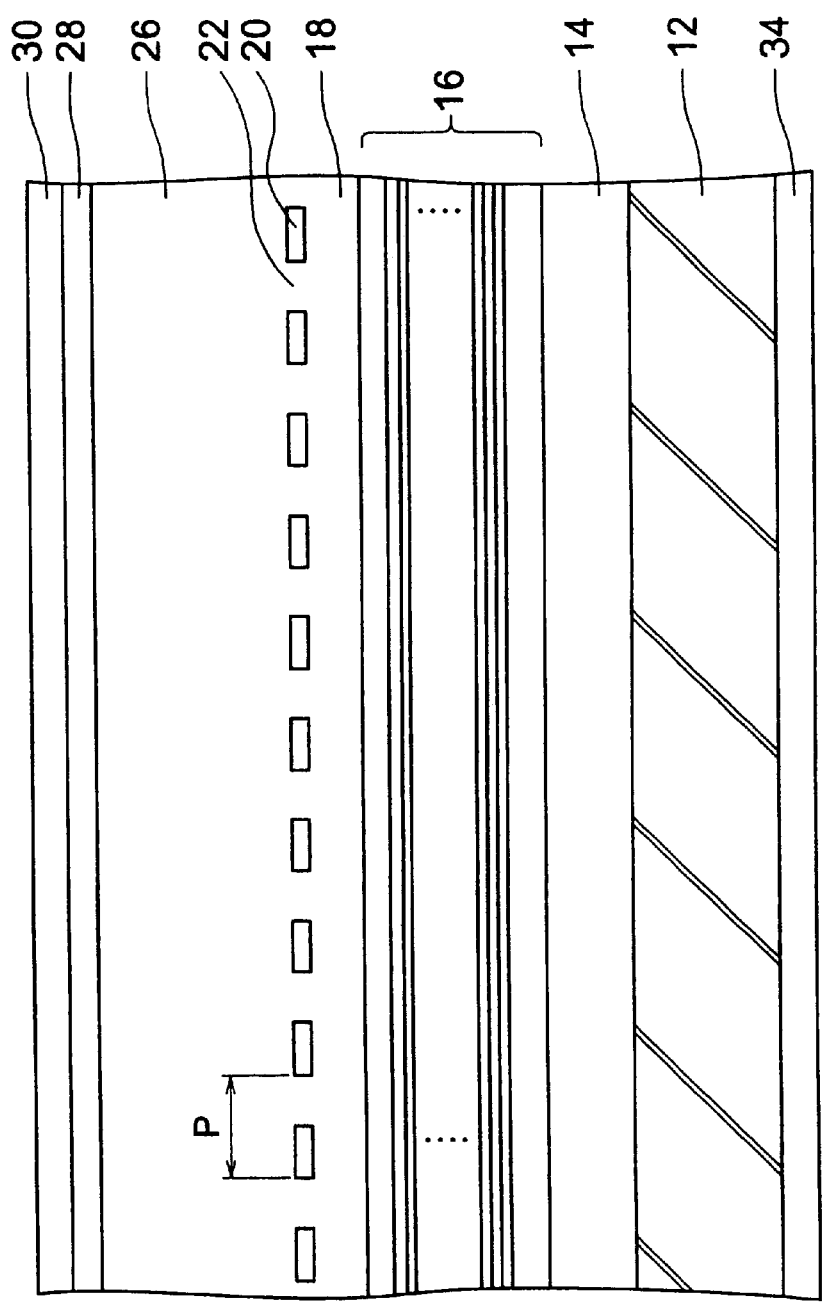
FIG. 2 is a sectional view of the semiconductor laser device taken along the arrowed line I—I of FIG. 1.

The present embodiment is an example where the semiconductor laser device according to the present invention is applied to a DFB laser device. FIG. 1 is a partially sectional perspective view showing the structure of the semiconductor laser device according to the present embodiment. FIG. 2 is a sectional view of the semiconductor laser device, taken along the arrowed line II—II of FIG. 1. It is to be noted that the compositions, film thicknesses, and the like of the compound semiconductor layers shown in the embodiment 1 and an embodiment 2 to be described later are exemplified for a better understanding of the present invention. The present invention is not limited to these illustrations.

The semiconductor laser device 10 according to the present embodiment is constituted as a buried hetero-junction type DFB laser device with the design lasing wavelength of 1550 nm.

The DFB laser device 10 has a laminated structure of a 1-μm-thick n-InP buffer layer 14, MQW-SCH active layers 16, a 200-nm-thick p-InP spacer layer 18, a diffraction grating 20 including a 20-nm-thick GaInAsP layer having a period P of 240 nm, and a p-InP first cladding layer 22 having the diffraction grating 20 buried therein. These layers are epitaxially grown on an n-InP substrate 12 in succession by a MOCVD method and the like.

The active layer 16 has a peak wavelength λg around 1530 nm in the optical gain distribution, and the diffraction grating 20 has a bandgap wavelength $\lambda_g$ around 1510 nm.

A top portion of the n-InP substrate 12 and the constituents of the laminated structure, i.e., the n-InP buffer layer 14, the active layer 16, the p-InP spacer layer 18, the diffraction grating 20, and the p-InP first cladding layer 22 having the diffraction grating 20 buried therein are etched into mesa stripes so that the active layer 16 has a width of 1.5 μm.

Then, carrier block structures each including a p-InP layer 24 and an n-InP layer 26 are formed on both sides of the mesa stripes.

The DFB laser device 10 also has a 2-μm-thick p-InP second cladding layer 28 and a heavily doped p-GaInAs contact layer 30 over the first InP cladding layer 22 and the n-InP layer 26. It also includes a p-side electrode 32 made of a Ti/Pt/Au laminated metal film over the contact layer 30, and an n-side electrode 34 made of AuGeNi on the bottom surface of the substrate 12.

In the present embodiment, GaInAsP having a bandgap wavelength $\lambda_g$ around 1510 nm is used to form the diffraction grating 20. Thus, in the diffraction grating 20, while the tails of the band edges cause some absorption in the vicinity of 1530 nm which is the peak wavelength of the optical gain distribution of the active layer 16, little absorption occurs at wavelengths around 1550 nm which is the designed lasing wavelength. That is, the absorption coefficient with respect to the peak wavelength of the optical gain distribution of the active layer exceeds the absorption coefficient with respect to the lasing wavelength.

It is to be noted that a larger difference between the absorption coefficients can also be achieved by setting the bandgap wavelength $\lambda_g$ of the diffraction grating 20 between the peak wavelength 1530 nm of the optical gain distribution of the active layer and the lasing wavelength 1550 nm of the DFB laser 10.

In order to evaluate the DFB laser device 10 of the present embodiment, wafers having the above-described laminated structure were cleaved into chips, bonded to can-package type stems, subjected to coating the front facet to form a non-reflective film and at the rear facet to form a high-reflectance film, and measured for the laser characteristics thereof. The following are the results of the measurements.

The DFB laser device 10 lased with stability in an excellent single mode and offered a side mode suppression ratio as large as 45–50 dB. It is to be noted that, DFB laser devices of conventional type, greater in the bandgap wavelength of their diffraction grating (hereinafter, referred to as conventional type DFB laser devices) hardly offer such a high side mode suppression ratio, generally remaining around 35–40 dB.

In addition, the threshold current was as low as 9 mA in the present embodiment. The lasing efficiency was compared with that of the conventional type DFB laser devices, revealing that the absorption with respect to the lasing wavelength of the diffraction grating 20 was sufficiently lower. It is then considered that the diffraction grating 20 functioned in a selectively absorptive manner with respect to the mode near the peak wavelength of the optical gain distribution of the active layer 16 so that Fabry-Perot lasing in the vicinity of the gain peak wavelength was suppressed to improve the side mode suppression ratio.

In the present embodiment, the bandgap wavelength $\lambda_g$ of the diffraction grating 20 (1510 nm) is made greater than the bandgap wavelength $\lambda_g$ of a conventional DFB laser device, e.g., 1200 nm. This enlarges the difference between the refractive index of the diffraction grating 20 and that of the surrounding InP layers. Therefore, even if the p-InP spacer layer 18 is increased in thickness to separate the diffraction grating 20 away from the active layer 16, it is possible to obtain a diffraction grating coupling coefficient of adequate magnitude. Accordingly, the tolerance in the crystal growing process and in the fabrication process is alleviated to allow a stable crystal growth.

Figure 3:
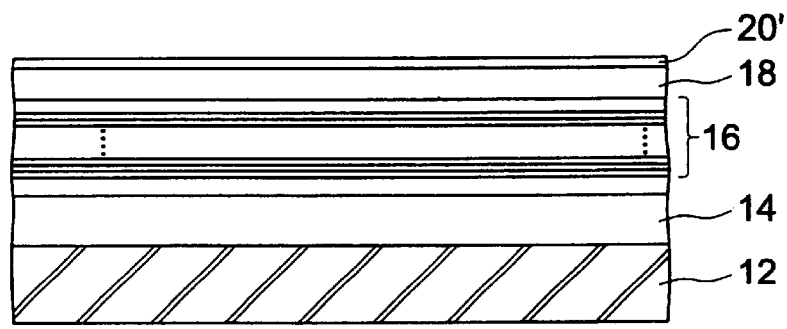
FIGS. 3(a)–(c) are sectional views in steps of fabricating the semiconductor laser device according to the first embodiment.
Figure 3:
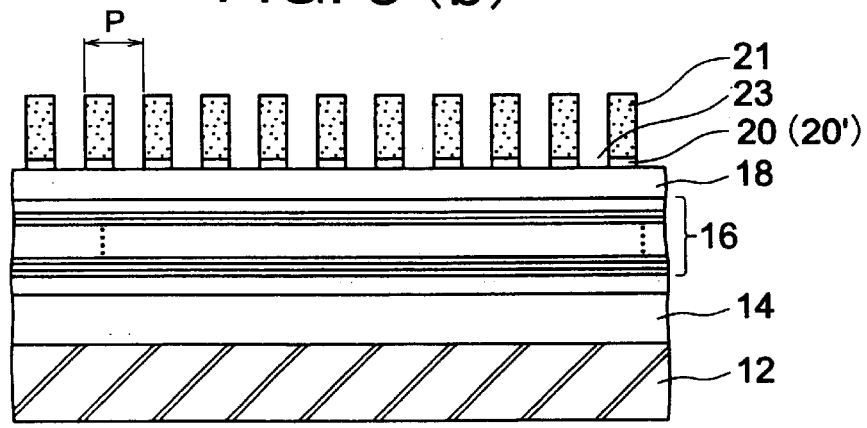
Figure 3:
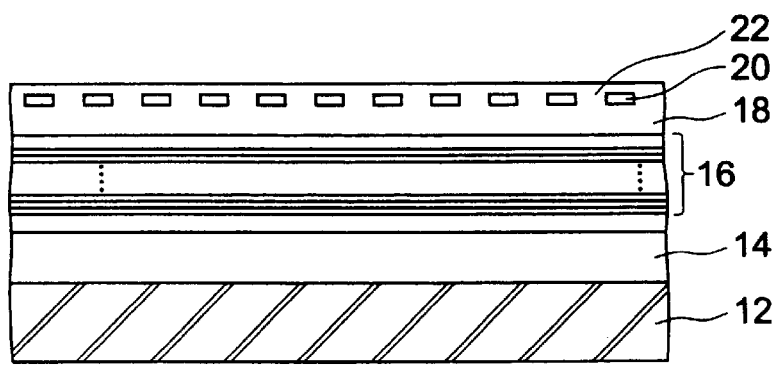

Hereinafter, a method of fabricating the DFB laser device 10 according to the embodiment 1 will be described with reference to FIGS. 3(a)–(c) and FIGS. 4(d)–(e). These figures are sectional views in the steps of fabricating the DFB laser device 10 according to the embodiment 1. FIGS. 3(a)–(c) show cross sections taken along the arrowed line I—I of FIG. 1. FIGS. 3(d) and 3(e) show cross sections taken along the arrowed line II—II of FIG. 1.

Initially, a 1-μm-thick n-InP buffer layer 14, MQW-SCH active layers 16, a 200-nm-thick p-InP spacer layer 18, and a 20-nm-thick GaInAsP diffraction grating layer 20' are epitaxially grown on an n-InP substrate 12 in succession, in a MOCVD (metal-organic chemical deposition) system at a growth temperature of 600° C. This forms a laminated structure as shown in FIG. 3(a).

Subsequently, an electron beam (EB) resist is applied onto the diffraction grating layer 20' with a thickness around 100 nm, followed by a drawing in an EB etching system to form a diffraction grating pattern 21 having a period P of 240 nm.

Thereafter, etching is performed in a dry etching system with the diffraction grating pattern 21 as the mask, whereby trenches 22 penetrating the diffraction grating layer 20' are formed to expose the p-InP spacer layer 18 at the trench bottoms. This forms a diffraction grating 20 as shown in FIG. 3(b).

Next, the diffraction grating patter 21 is removed. Then, as shown in FIG. 3(c), a p-InP first cladding layer 22 to bury the diffraction grating 20 is re-grown in the MOCVD system.

Thereafter, a $SiN_x$ film is formed over the p-InP first cladding layer 22 in a plasma CVD system. Then, using a photolithography and reactive ion etching system (RIE), the $SiN_x$ film is processed into a stripe to form a $SiN_x$ film mask 25.

Subsequently, using the $SiN_x$ film mask 25 as the etching mask, the p-InP first cladding layer 22 (diffraction grating 20), the p-InP spacer layer 18, the active layer 16, the n-InP buffer layer 14, and a top portion of the n-InP substrate 12 are etched into mesa stripes with an active layer width of the order of 1.5 μm.

Moreover, using the $SiN_x$ film mask 25 as the selective growth mask, a p-InP layer 24 and an n-InP layer 26 are selectively grown in succession. This forms carrier block (I structures on both sides of the mesa stripes as shown in FIG. 4(d).

Next, the $SiN_x$ film mask 25 is removed before a 2-μm-thick p-InP second cladding layer 28 and a contact layer 30, or a GaInAs layer that is heavily doped to make an ohmic contact with a p-side electrode 32, are epitaxially grown as shown in FIG. 4(e).

The n-InP substrate 12 is polished at its bottom surface to a substrate thickness of the order of 120 μm. Then, a Ti/Pt/Au laminated metal film is formed as the p-side electrode 32 over the contact layer 30. On the bottom surface of the substrate is formed an AuGeNi film as an n-side electrode 34.

The wafer having the above-described laminated structure can be cleaved into a chip and bonded to a can-package type stem to form the DFB laser device 10 whose laminated structure is shown in FIG. 1.

In the present embodiment, bringing the bandgap wavelength of the diffraction grating 20 close to that of the active layer 16 consequently increases the difference in refractive index between the diffraction grating and the surrounding InP layer. This allows a desired refractive index coupling coefficient to be obtained even if the diffraction grating 20 is separated farther from the active layer 16 than in the conventional DFB laser devices. Accordingly, the tolerance in the crystal growing process and in the fabrication process is eased to allow stable crystal growth.

Embodiment 2

Figure 5:
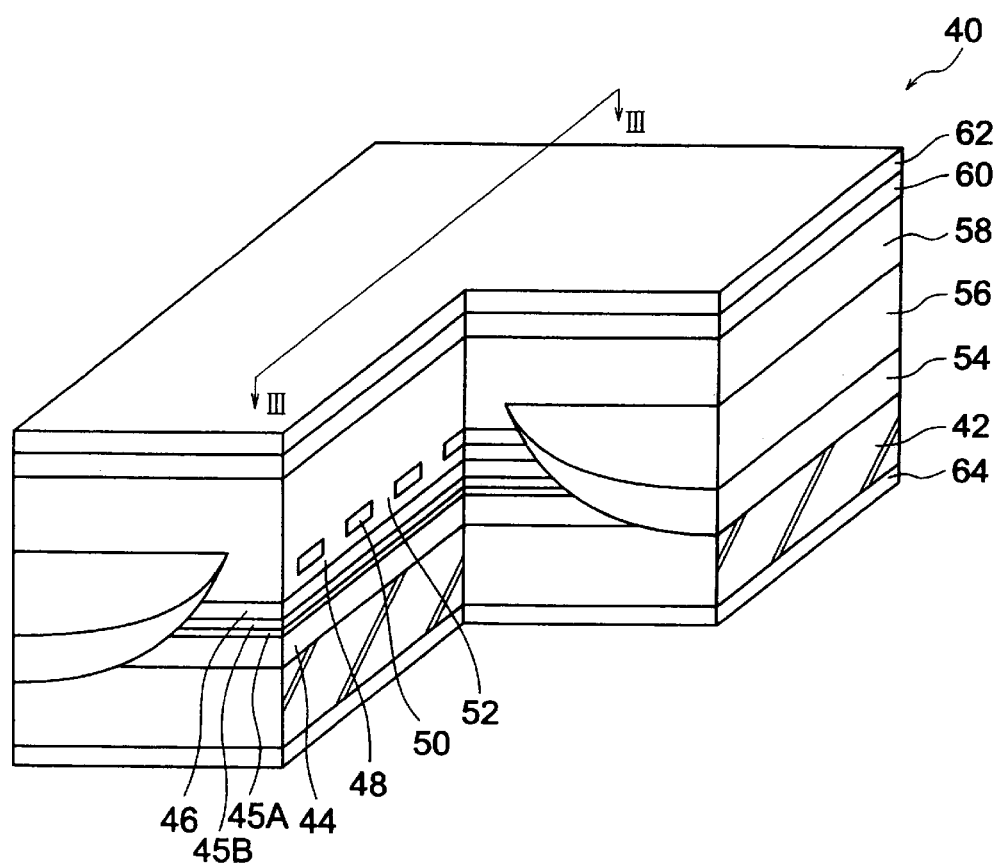
FIG. 5 is a partially sectional perspective view showing the structure of a semiconductor layer device according to a second embodiment.
Figure 6:
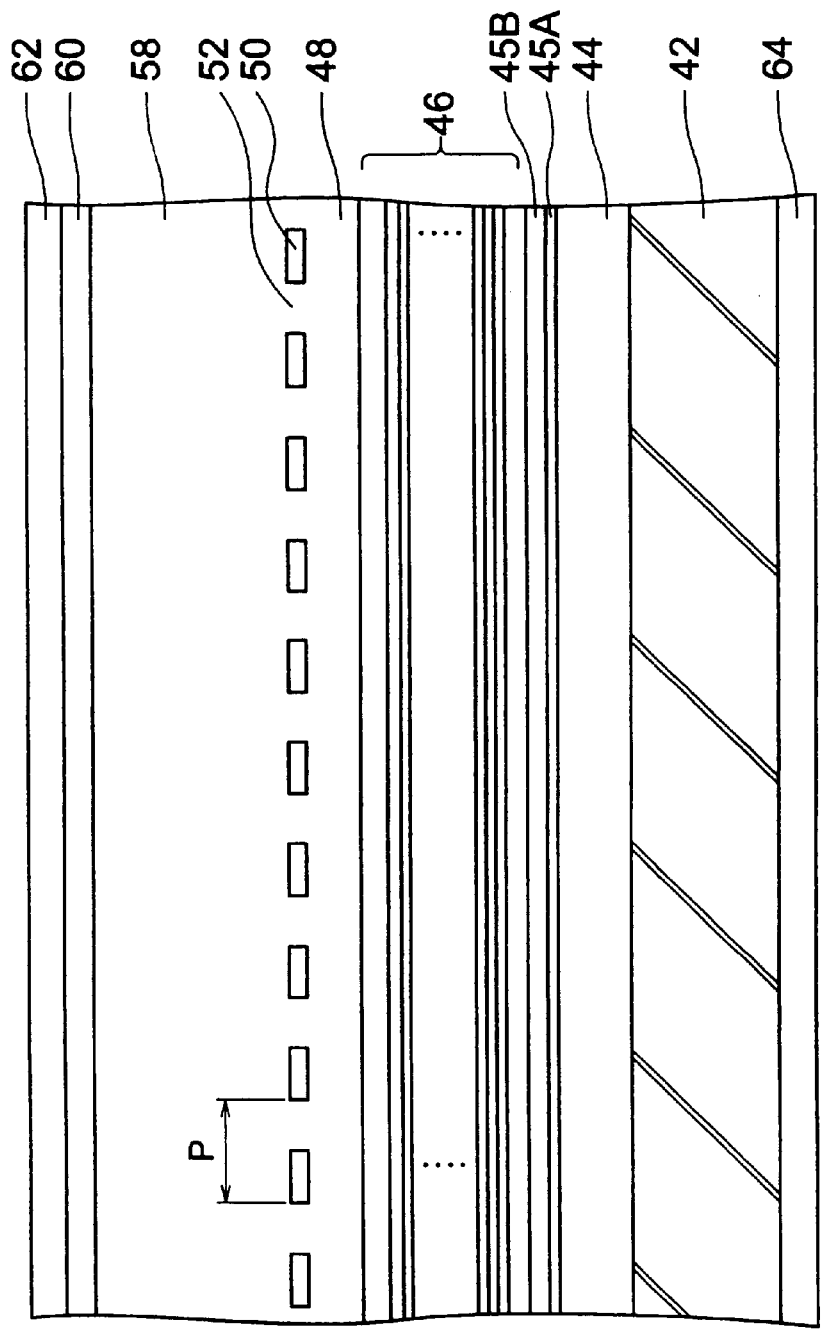
FIG. 6 is a sectional view of the semiconductor laser device taken along the arrowed line III—III of FIG. 5.

The present embodiment is another example where the semiconductor laser device according to the present invention is applied to a DFB laser device. FIG. 5 is a partially sectional perspective view showing the configuration of the semiconductor laser device according to the present embodiment. FIG. 6 is a sectional view taken along the arrowed line III—III of FIG. 5.

In the DFB laser device 10 of the embodiment 1, it is the diffraction grating 20 formed as a wavelength selecting structure capable of selecting the lasing wavelength $\lambda_c$ independent of the optical gain distribution of the active layer that functions as the layer for selectively absorbing the light in the mode of the gain peak wavelength. On the other hand, the semiconductor laser device 40 of the present embodiment, though constituted likewise as a buried heterojunction type DFB laser device with is the designed lasing wavelength of 1550 nm, includes a selective absorption layer for selectively absorbing the light in the mode of the peak wavelength of the optical gain distribution of the active layer, aside from the diffraction grating.

The DFB laser device 40 includes a 1-μm-thick n-InP buffer layer 44, a selective absorption layer 45A including a 5-nm-thick InGaAs layer, a 100-nm-thick n-InP spacer layer 45B, MQW-SCH active layers 46, a 100-nm-thick p-InP spacer layer 48, a diffraction grating 50 including a 30-nm-thick GaInAsP layer having a period P of 240 nm, and a p-InP first cladding layer 52 having the diffraction grating 50 buried therein. These layers are epitaxially grown on an n-InP substrate 42 in succession by the MOCVD method and the like.

The selective absorption layer 45A has a bandgap wavelength $\lambda_g$ of 1540 nm the active layer 46 a bandgap wavelength $\lambda_g$ of 1530 nm, and the diffraction grating 50 a bandgap wavelength around 1200 nm. Thus, the diffraction grating 50 is sufficiently transparent to the peak wavelength of approximately 1530 nm of the optical gain distribution of the active layer 46, and to the wavelength of 1550 nm which is the designed lasing wavelength of the DFB laser device 40.

The thickness of the selective absorption layer 45A is small enough to develop the quantum effect, and is controlled so that the absorption edge wavelength (equivalent to bandgap wavelength) falls around 1540 nm. Thus, the selective absorption layer 45A functions as a quantum well layer. Accordingly, the absorption coefficient of the selective absorption layer 45A, while showing some absorption around 1530 nm which is the peak wavelength of the optical gain distribution of the active layer 46, allows little absorption with respect to wavelengths around 1550 nm which is the designed lasing wavelength.

Owing to the provision of the selective absorption layer 45A having a steep absorption edge having quantum effects, it becomes possible to realize an absorption region that has a significant difference between the absorption coefficient with respect to the peak wavelength of the optical gain distribution of the active layer 46 and the absorption coefficient with respect to the lasing wavelength (nearly zero).

While in the present embodiment the single-layered quantum well layer 45A is used as the selective absorption region, multiple-quantum-well layers may be formed to achieve a greater difference in absorption coefficient.

In the semiconductor layer device 40 according to the present embodiment, the quantum well layer or quantum dot layer with a steep absorption edge is provided as the selective absorption layer 45A to allow an increase in the difference between the absorption coefficients at the gain peak wavelength and the lasing wavelength.

While in the present embodiment the selective absorption layer 45A is opposed to the diffraction grating across the active layer, it may be arranged on the same side as the diffraction grating. The opposite-side arrangement, however, has a higher degree of flexibility in design.

A top portion of the n-InP substrate 42, and the constituents of the laminated structure, i.e., the n-InP buffer layer 44, the selective absorption layer 45A, the n-InP spacer layer 45B, the active layer 46, the p-InP spacer layer 48, the diffraction grating 50, and the p-InP first cladding layer 52 having the diffraction grating 50 buried therein are etched into mesa stripes so that the active layer 46 has a width of 1.5 μm.

Then, carrier block structures each including a p-InP layer 54 and an n-InP layer 56 are formed on both sides of the mesa stripes.

Furthermore, the semiconductor laser device 40 has a 2-μm-thick p-InP second cladding layer 58 and a heavily doped p-GaInAs contact layer 60 over the first InP cladding layer 52 and the n-InP layer 60. It also includes a p-side electrode 62 including a Ti/Pt/Au laminated metal film over the contact layer 60, and an n-side electrode 64 made of AuGeNi on the bottom surface of the substrate 42.

In order to evaluate the DFB laser device 40 according to the present embodiment, wafers having the above-described laminated structure were cleaved into chips, bonded to can-package type stems, subjected to coating the front facet to form a non-reflective film and at the rear facet to from a high-reflectance film, and measured for the laser characteristics thereof. The following are the results of the measurements.

The DFB laser device 40 kept a stable lasing in a desirable single mode at the lasing wavelength of 1550 nm as intended. The side mode suppression ratio was as extremely desirable as approximately 50 dB. The threshold current was 8 mA, a value equivalent to that of the conventional DFB lasers. Thus, the absorption by the selective absorption layer 45A at the lasing wavelength is considered almost negligible.

In addition, the ratio between the peak and valley of the Fabry-Perot mode near the peak wavelength of the optical gain distribution of the active layer 46 was smaller than in the conventional DFB lasers. The mode in this vicinity underwent a loss from the selective absorption layer 45A, so that the Fabry-Perot mode lasing was suppressed.

Besides, a DFB laser device having the same structure as that of the DFB laser device 40 and wherein the period of the diffraction grating 50 is extended to set the lasing wavelength at 1570 nm was also observed and found to maintain a stable lasing in a single mode at the lasing wavelength of 1570 nm.

Thus, even under considerable detuning toward longer wavelengths from the peak wavelength (1530 nm) of the optical gain distribution of the active layer, the selective absorption layer 45A can suppress lasings in the modes near the gain peak, to keep the stable single-mode lasing.

Figure 7:
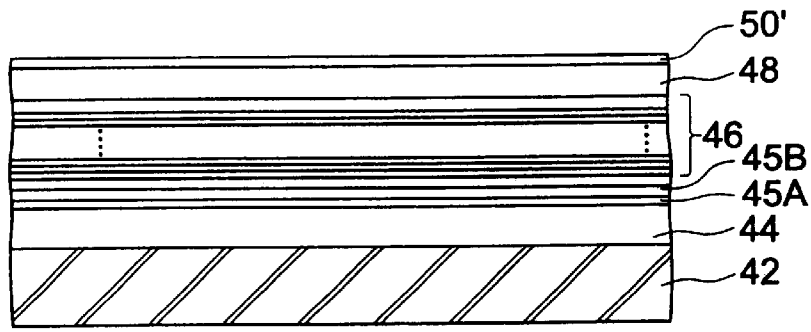
FIGS. 7(a)–(c) are sectional views in steps of fabricating the semiconductor laser device according to the second embodiment.
Figure 7:
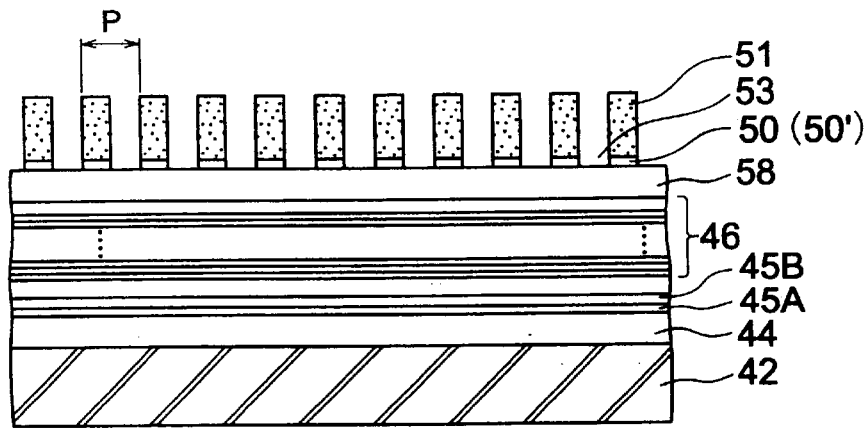
Figure 7:
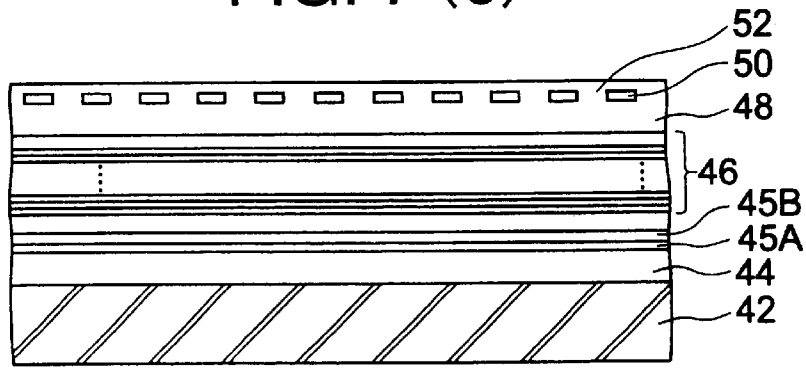
Figure 8:
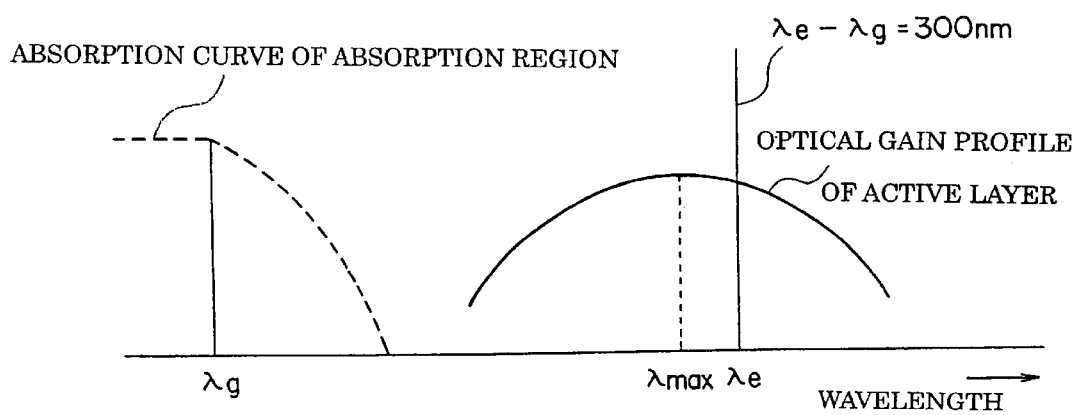
FIGS. 8(a) and (b) are schematic diagrams showing the relations among λe, λmax, and λg in the first and second conventional examples.
Figure 8:
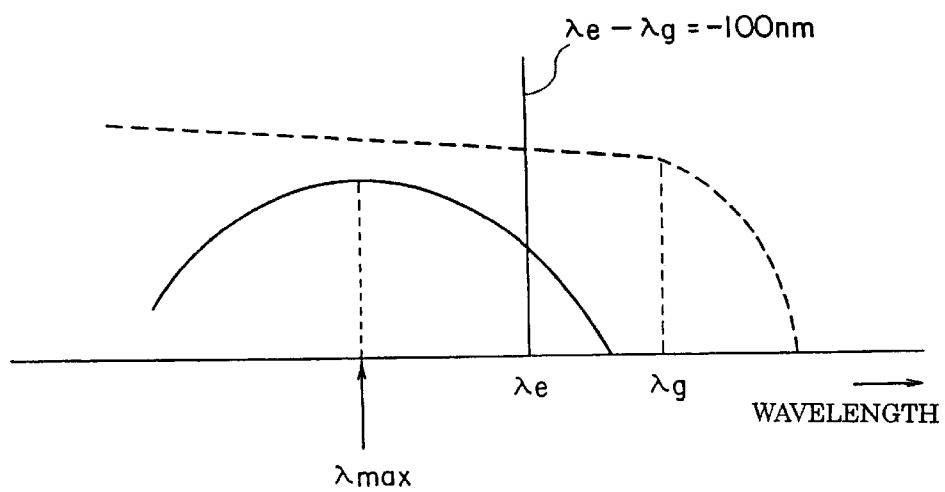
Figure 9:
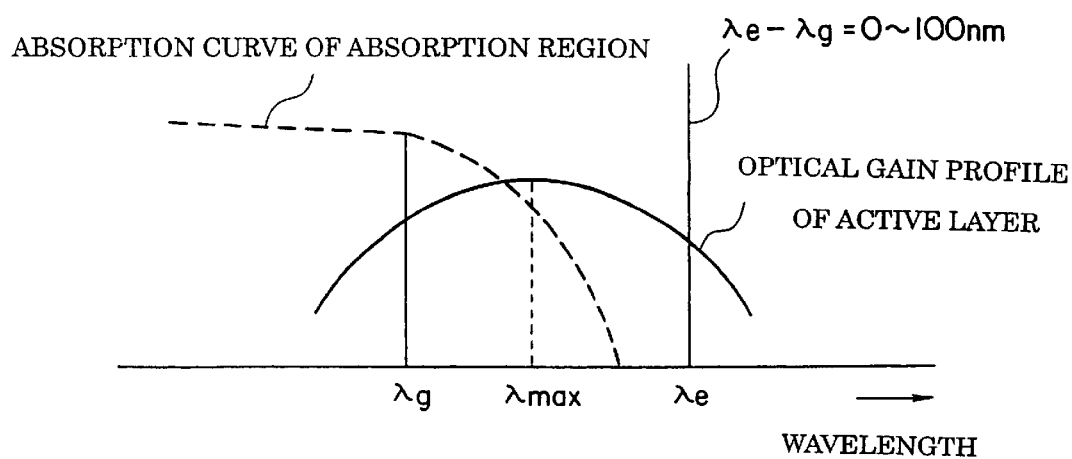
FIGS. 9(a) and (b) are schematic diagrams showing the relations among λe, λmax, and λg in the second invention.
Figure 9:
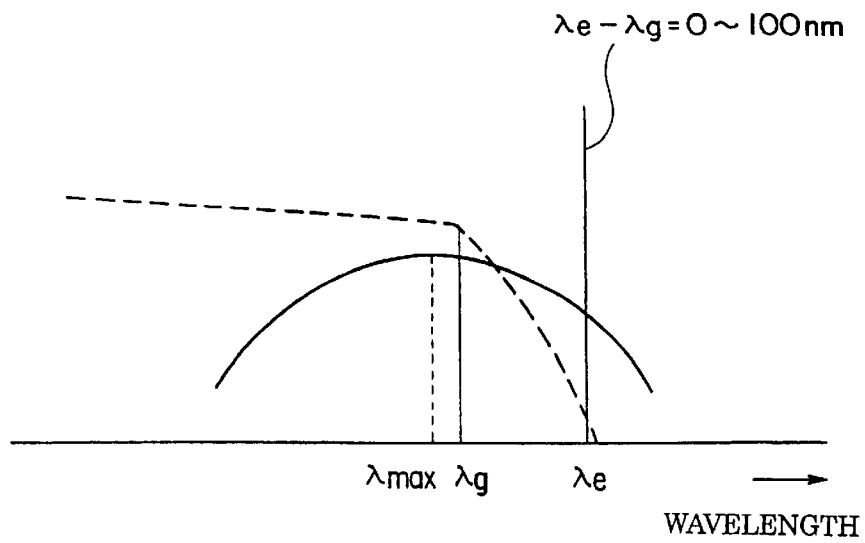
Figure 10:
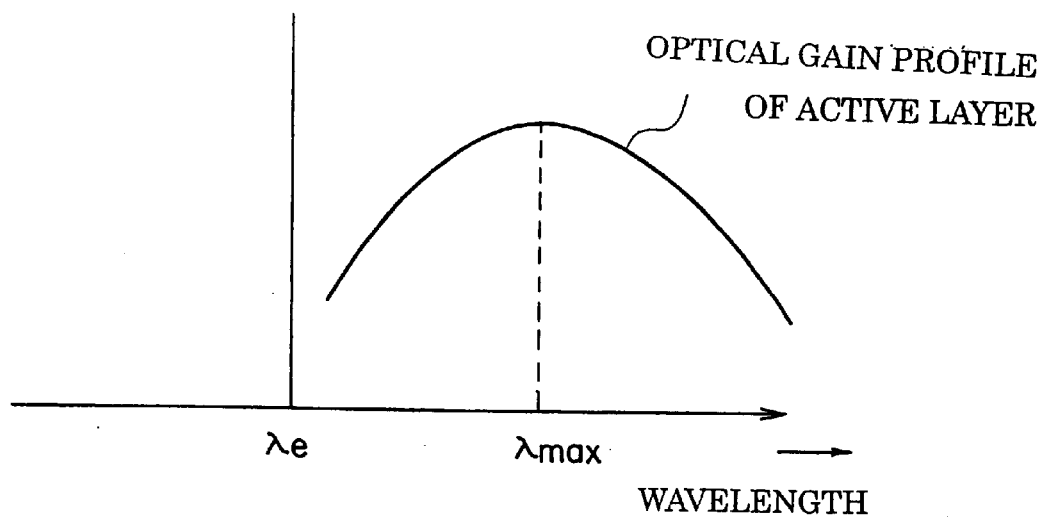
FIG. 10 is a schematic diagram for explaining the embodiments of the first through third inventions, or the semiconductor laser devices of λmax>λe.

Now, a method of fabricating the semiconductor laser device 40 according to the embodiment 2 will be described with reference to FIGS. 7(*a*)–(*c*). FIGS. 7(*a*)–(*c*) are sectional views in the steps of fabricating the semiconductor laser device 40 according to the embodiment 2. Initially, as shown in FIG. 7(*a*), an n-InP buffer layer 44, a selective absorption layer 45A including an InGaAs layer, an n-InP spacer layer 45B, MQW-SCH active layers 46, a p-InP spacer layer 48, and a diffraction grating layer 50' including an InGaAsP layer are epitaxially grown on an n-InP substrate 42 in succession, in an MOCVD system at a growth temperature of 600° C.

An electron beam (EB) resist is applied onto the diffraction grating layer 50' with a thickness of 100 nm, followed by drawing in an EB etching system to form a diffraction grating pattern 51 having a period P of 240 nm.

Thereafter, etching is performed in a dry etching system with the diffraction grating pattern 51 as the etching mask, whereby trenches 53 penetrating the diffraction grating layer 50' are formed to expose the p-InP spacer layer 48 at the trench bottoms. This forms a diffraction grating 50 as shown in FIG. 7(*b*).

As shown in FIG. 7(*c*), a p-InP first cladding layer 52 for burying the diffraction grating 50 is re-grown.

Subsequently, in the same manner as in the embodiment 1, the p-InP first cladding layer 52, the diffraction grating 50, the p-InP spacer layer 48, the active layer 46, the n-InP spacer layer 45B, the selective absorption layer 45A, the n-InP buffer layer 44, and a top portion of the n-InP substrate 42 are etched into mesa stripes with an active layer width of the order of 1.5 μm, using an $SiN_x$ film mask as the etching mask.

Thereafter, with the $SiN_x$ film mask as the selective growth mask, a p-InP layer 54 and an n-InP layer 56 are selectively grown in succession to form carrier block structures on both sides of the mesa stripes Then, the $SiN_x$ film mask is removed before a 2-μm-thick p-InP second cladding layer 58 and a heavily doped GaInAs contact layer 60 are epitaxially grown.

The n-InP substrate 42 is polished at its bottom surface to a substrate thickness of the order of 120 μm. Then, a Ti/Pt/Au laminated metal film is formed as a p-side electrode 62 over the contact surface 60. On the bottom surface of the substrate is formed an AuGeNi film as an n-side electrode 64.

Figure 4:
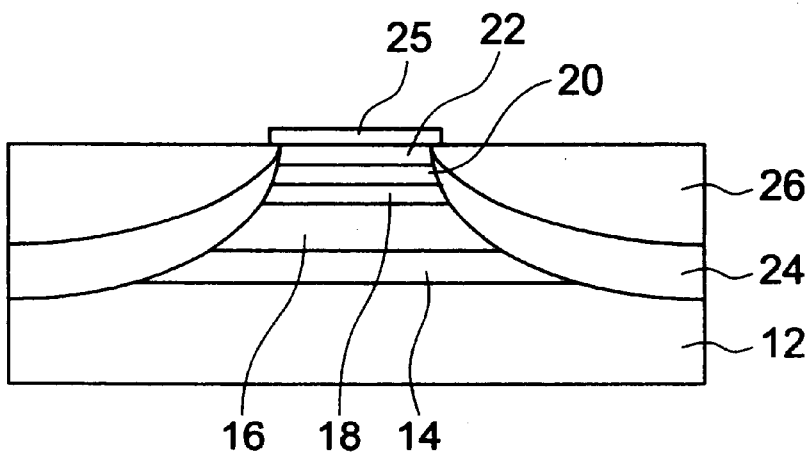
FIGS. 4(d) and (e) are sectional views in steps of fabricating the semiconductor laser device according to the first embodiment.
Figure 4:
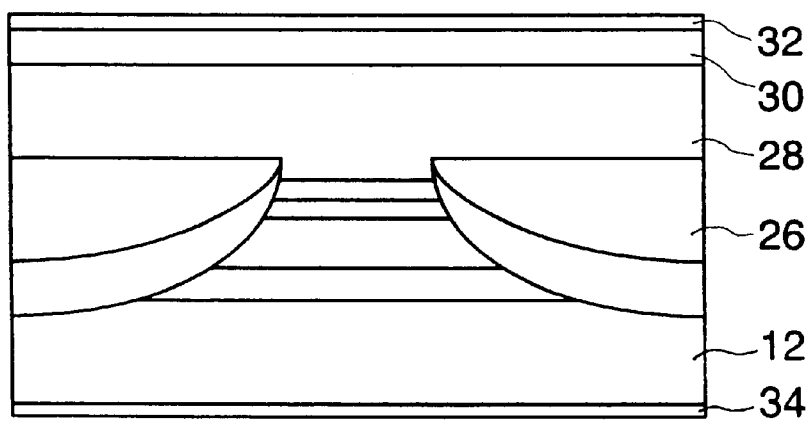

The wafer having the above-described laminated structure can be cleaved into a chip and bonded to a can-package type stem to form the semiconductor layer device 40 whose laminated structure is shown in FIGS. 4 and 5.

While the embodiments 1 and 2 have dealt with DFB laser devices of a 1550-nm band, the semiconductor laser device according to the present invention is similarly applicable to other wavelength bands.

In the embodiments, the selective absorption layer 45A and the diffraction grating 20 are arranged over the entire length of the resonators. However, they can be arranged in part of the resonators for the same effects as those of the embodiments.

Furthermore, the semiconductor laser device according to the present invention is applicable not only to DFB laser devices but also to DBR laser devices, FBG laser devices, and other semiconductor laser devices that include a wavelength selecting structure in the vicinity of the active layer in their resonator structure, the wavelength selecting structure being capable of selecting an lasing wavelength $\lambda_e$ independent of the optical gain distribution of the active layer, and emit laser light of the selected lasing wavelength $\lambda_c$.

What is claimed is:

1. A semiconductor laser device comprising:

a semiconductor substrate;

a resonator structure including an active layer overlying said semiconductor substrate and including an absorption region disposed adjacent to the active layer in a laminated structure including said active layer; and a wavelength selecting structure formed above said active layer and configured to select a lasing wavelength $\lambda e$ independent of an optical gain distribution of said active layer, wherein said absorption region is made of a compound semiconductor layer having an absorption coefficient $\lambda$max with respect to a peak wavelength $\lambda$max of said optical gain distribution of said active layer which exceeds an absorption coefficient $\alpha e$ of said absorption region with respect to said lasing wavelength $\lambda e$.

2. The semiconductor laser device according to claim 1, wherein said absorption region is formed of a quantized compound semiconductor layer.

3. The semiconductor laser device according to claim 1, wherein:

said absorption region is formed of a quantized compound semiconductor layer; and said peak wavelength $\lambda$max of said optical gain distribution of said active layer satisfies $\lambda e<\lambda$max with respect to said lasing wavelength $\lambda e$.

4. The semiconductor laser device according to claim 1, wherein:

said wavelength selecting structure is composed of a diffraction grating; and said diffraction grating functions as said absorption region.

5. The semiconductor laser device according to claim 1, wherein:

said wavelength selecting structure is composed of a diffraction grating; and a selective absorption layer which functions as said absorption region is formed in the vicinity of said active layer separately from said diffraction grating.

6. A semiconductor laser device comprising:

a semiconductor substrate;

a resonator structure including an active layer overlying said semiconductor substrate and including an absorption region disposed adjacent to the active layer in a laminated structure including said active layer; and a wavelength selecting structure formed above said active layer and configured to select a lasing wavelength $\lambda e$ independent of an optical gain distribution of said active layer, wherein said absorption region is made of a compound semiconductor layer having an absorption coefficient $\lambda$max with respect to a peak wavelength $\lambda$max of said optical gain distribution of said active layer which exceeds an absorption coefficient $\alpha e$ of said absorption region with respect to said lasing wavelength $\lambda e$, wherein a bandgap wavelength $\lambda g$ of said absorption region and said lasing wavelength $\lambda e$ satisfy $0<\lambda e-\lambda g<100$ nm.

7. The semiconductor laser device according to claim 6, wherein said bandgap wavelength $\lambda g$ of said absorption region (20, 45A) and said lasing wavelength $\lambda e$ satisfy $0<\lambda e-\lambda g \leqq 70$ nm.

8. The semiconductor laser device according to any one of claims 1, 6, and 7, wherein said absorption region satisfies $\alpha$max$-\alpha e \geqq 1$ cm$^{-1}$ in terms of waveguide loss.

9. The semiconductor laser device according to any one of claims 1, 6, and 7, wherein $\alpha e$ is substantially zero in said absorption region.

10. A semiconductor laser device comprising:

a semiconductor substrate;

a resonator structure including an active layer overlying said semiconductor substrate and including an absorption region disposed adjacent to the active layer in a laminated structure including said active layer; and a wavelength selecting structure formed above said active layer and configured to select a lasing wavelength $\lambda e$ independent of an optical gain distribution of said active layer, wherein said absorption region is made of a compound semiconductor layer having an absorption coefficient $\alpha$max with respect to a peak wavelength $\lambda$max of said optical gain distribution of said active layer which exceeds an absorption coefficient $\alpha e$ of said absorption region with respect to said lasing wavelength $\lambda e$, wherein said absorption region satisfies $\alpha$max$-\alpha e \geqq 1$ cm$^{-1}$ in terms of waveguide loss, and wherein $\alpha e$ is substantially zero in said absorption region.

11. A semiconductor laser device comprising:

a semiconductor substrate;

a resonator structure including an active layer overlying said semiconductor substrate and including an absorption region disposed adjacent to the active layer in a laminated structure including said active layer; and a wavelength selecting structure formed above said active layer and configured to select a lasing wavelength $\lambda e$ independent of an optical gain distribution of said active layer, wherein said absorption region is made of a compound semiconductor layer, wherein a bandgap wavelength $\lambda g$ of said absorption region and said lasing wavelength$\lambda e$ satisfy $0<\lambda e-\lambda g \leqq 100$ nm, wherein said absorption region satisfies $\alpha$max$-\alpha e \geqq 1$ cm$^{-1}$ in terms of waveguide loss, and wherein $\alpha e$ is substantially zero in said absorption region.

* * * * *